United States Patent [19]
Shim et al.

[11] Patent Number: 6,100,103
[45] Date of Patent: Aug. 8, 2000

[54] HIGHLY INTEGRATED MULTICOLOR LIGHT EMITTING DEVICE AND A METHOD FOR MANUFACTURING THE SAME

[75] Inventors: Kyu Hwan Shim; Mun Cheol Baek; Hae Kwon Lee; Ki Soo Nam, all of Daejeon, Rep. of Korea

[73] Assignee: Electronics and Telecommunications Research Institute, Daejeon, Rep. of Korea

[21] Appl. No.: 09/157,541

[22] Filed: Sep. 21, 1998

[30] Foreign Application Priority Data

May 21, 1998 [KR]  Rep. of Korea ................. 98-18328

[51] Int. Cl.[7] ................................................. H01L 21/44
[52] U.S. Cl. ................................. 438/26; 438/28; 438/35; 438/455; 438/106
[58] Field of Search .................................. 438/26, 22, 25, 438/28, 34, 35, 46, 47, 455, 456, 106, 108, 602, 956, 605, 617, 611, 612, FOR 416, FOR 417, FOR 287, FOR 157; 257/81, 91, 88, 89, 99

[56] References Cited

U.S. PATENT DOCUMENTS

| | | |
|---|---|---|
| 4,211,586 | 7/1980 | Fang et al. . |
| 5,360,761 | 11/1994 | Andrews ................................. 438/28 |
| 5,385,632 | 1/1995 | Goossen ................................. 428/25 |
| 5,432,358 | 7/1995 | Nelson et al. . |
| 5,478,778 | 12/1995 | Tanisawa ................................. 438/26 |
| 5,583,350 | 12/1996 | Norman et al. . |
| 5,597,740 | 1/1997 | Ito et al. . |
| 5,712,192 | 1/1998 | Lewis et al. ............................. 438/611 |
| 5,739,552 | 4/1998 | Kimura et al. ........................... 257/89 |
| 5,780,321 | 7/1998 | Shieh et al. ............................. 438/34 |
| 5,920,766 | 7/1999 | Floyd ..................................... 438/34 |

OTHER PUBLICATIONS

Kenzo Hatada et al., "LED Array Modules by New Technology Microbump Bonding Method", IEEE Transactions on Components, Hybrids, and Manufacturing Technology, vol. 13, No. 3, Sep. 1990, pp. 521–527.

Bill Imler, et al., "Precision Flip–Chip Solder Bump Interconnects for Optical Packaging", 1992 IEEE, pp. 508–512.

*Primary Examiner*—Savitri Mulpuri
*Attorney, Agent, or Firm*—Jacobson, Price, Holman & Stern, PLLC

[57] ABSTRACT

The present invention has been made in view of the above mentioned problem, and the present invention provides a highly integrated multicolor light emitting device which emits multiple colors in a chip by integrating light emitting devices of different colors, and in accordance with an aspect of the present invention, there is disclosed a light emitting device including: a plurality of light emitting elements formed on a substrate each of which comprises a plurality of semiconductor layers, wherein each of the plurality of light emitting elements radiates a light of different wavelength from one another.

9 Claims, 6 Drawing Sheets

HIGHLY INTEGRATED MULTICOLOR LIGHT EMITTING DEVICE AND A METHOD FOR MANUFACTURING THE SAME

FIELD OF THE INVENTION

The present invention relates to a compound semiconductor optical device, particularly to a highly integrated multicolor light emitting device and a method for manufacturing the same.

BACKGROUND OF THE INVENTION

Conventionally, cathode-ray tubes("CRT") or bulbs are used for display panel. However, the CRT's or bulbs consume large amount of electric power and generate a lot of heat when used for display panel. Especially, when a display panel uses bulbs as display elements, a colored glass is needed to represent a pixel and 7 Watts of electric power is consumed for each bulb. Further, since the lifetime of each bulb is 8,000 to 10,000 hours, the cost for maintenance and repair is very high.

As information society is coming, technologies for displaying high quality information on flat panel displays are rapidly developed. Further, since the high quality display system can be used in a variety of everyday life as well as special technical field including military and aviation, the needs for the high quality display system is rapidly growing. Therefore, it is required to develop a display device having characteristics of high efficiency, wide width, light weight, small unit pixel, broad visual angle, high resolution and natural colors.

The development of display technologies using semiconductor light emitting devices is delayed due to the difficulties in making blue color light emitting devices and green color light emitting devices. Recently, wide band gap compound semiconductors, such as SiC, AlN, GaN, ZnSe, are studied to be applied to short wavelength optical devices. In 1994, a blue color light emitting diode("LED") has been put to practical use. These compound semiconductors have advantages of high thermal stabilities, wide controllabilties of energy gaps, high radiation efficiencies and long life time even if there are some defects in the devices. Further, they can radiate lights of all frequency ranges of visible rays and a high molecule thin film structure has also been developed to be put to practical use.

As described above, the examples of natural color display a technologies are numerous in order to fulfill the needs for them. One of the examples is light emitting device for natural color display developed by Sharp Corporation ("Sharp"). However, since the light emitting device of Sharp has a unit cell of which the size is 3 mm×3 mm, it is difficult to integrate those unit cells in a display panel.

SUMMARY OF THE INVENTION

Therefore, the present invention has been made in view of the above mentioned problem, and the present invention provides a highly integrated multicolor light emitting device which emits multiple colors in a chip by integrating light emitting devices of different colors. Further, the present invention provides a method for manufacturing the highly integrated multicolor light emitting device.

In accordance with an aspect of the present invention, there is disclosed a light emitting device including: a plurality of light emitting elements formed on a substrate each of which comprises a plurality of semiconductor layers, wherein each of the plurality of light emitting elements radiates a light of different wavelength from one another.

In accordance with another aspect of the present invention, there is disclosed a light emitting device including: a red color light emitting element including a first clad layer, a first active layer and a second clad layer subsequently formed on a substrate; a transparent insulating layer formed on the second clad layer; a green color light emitting element including a third clad layer, a second active layer and a fourth clad layer subsequently formed on the transparent insulating layer; and a blue color light emitting element including a fifth clad layer, a third active layer and a sixth clad layer subsequently formed on the fourth clad layer.

In accordance with another aspect of the present invention, there is disclosed a method for manufacturing a light emitting device including the steps of: forming a p-type clad layer for blue color light emitting element, an active layer for blue color light emitting element, an n-type common clad layer, an active layer for green color light emitting element and a p-type clad layer for green color light emitting element on a transparent substrate, subsequently; forming a transparent insulating layer on the p-type clad layer for green color light emitting element; forming a p-type clad layer, an active layer and an n-type clad layer for red color light emitting element on the transparent insulating layer, subsequently; forming ohmic contact areas on the p-type clad layer for blue color light emitting element, the n-type common clad layer, the p-type clad layer for green color light emitting element and the p-type clad layer for red color light emitting element, respectively; forming metal contact layers on the ohmic contact areas of the p-type clad layer for blue color light emitting element, the n-type common clad layer, the p-type clad layer for green color light emitting element and the p-type clad layer for red color light emitting element, respectively; forming a first, a second and a third electrode in a wiring substrate, wherein ends of the first, second and third electrode are destined to be coupled to the p-type clad layers of the blue, green and red light emitting elements, respectively; forming a first and a second metal pad layers, wherein the first metal pad layer is destined to be coupled to the first, second and third electrodes and the second metal pad layer is destined to be coupled to the n-type clad layer for the red color light emitting element and the n-type common clad layer; forming metal bumps of different height on the first and second metal pad layers, respectively; bonding the metal contact layers onto the metal bumps, respectively, so that the red, green, blue color light emitting elements and the transparent substrate are formed in order.

BRIEF DESCRIPTION OF THE DRAWINGS

A further understanding of the nature and advantage of the present invention will become apparent by reference to the remaining portions of the specification and drawings, in which:

FIG. 5b is a plan view of FIG. 5a;

DETAILED DESCRIPTION OF THE PREFERRED EMBODIMENT

A detailed description of an embodiment according to the present invention will be given below with reference to the attached drawings.

The present invention utilizes solid state compound semiconductors, such as SiC, AlN, GaN, ZnSe, InGaAlP, GaAsP and AlGaAs, of which energy band gaps are controlled in a wide range, so that three light emitting elements for three primary colors(i.e. red, green and blue) are integrated in a chip of heterojunction structure.

Referring to FIGS. 1 to 7, the preferred embodiment of the present invention is described in detail, hereinafter.

Figure 1:
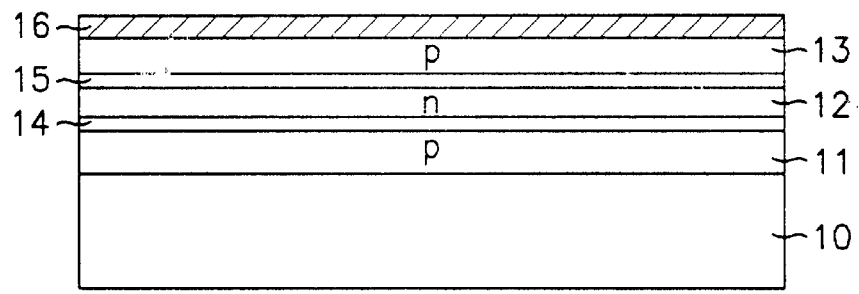
FIG. 1 is a cross sectional view showing a process step for forming blue and green color light emitting elements of a multicolor light emitting device according to the present invention.

First, referring to FIG. 1, FIG. 1 is a cross sectional view showing a process step for forming blue and green color light emitting elements in a heterojunction structure. As shown in FIG. 1, a p-type clad layer 11 and an active layer 14 for blue color light emitting element are successively formed on a transparent substrate 10. Then, an n-type clad layer 12 for blue and green color light emitting element is formed on the active layer 14. Further, an active layer 15 and a p-type clad layer 13 for green color light emitting element are successively formed on the n-type clad layer 12. A transparent insulating layer 16 is finally formed on the p-type clad layer 13.

The transparent substrate 10 may be selected from materials, such as sapphire, SiC or BN, having the characteristics of large band gap which is larger than the photon energy of the blue color light and high thermal conductivity, so that few radiation energy is absorbed and operation stability can be easily acquired. The transparent insulating layer 16 may be formed from the materials such as AlN, GaN, GaON or $Al_2O_3$ without impurities injected.

All of the p-type clad layer 11 for blue color light emitting element, the active layer 14 for blue color light emitting element, the n-type clad layer 12 for blue and green color light emitting element, the active layer 15 for green color light emitting element and the p-type clad layer 13 for green color light emitting element are epitaxial mono-crystalline layers formed by Molecular Beam Epitaxy("MBE") having plasma generator.

The p-type clad layer 11 for blue color light emitting element, the n-type clad layer 12 for blue and green color light emitting element, and the p-type clad layer 13 for green color light emitting element are respectively formed of compound semiconductor thin films of two-molecule compounds, such as GaN, AlN, InN, SiC and ZnSe, three-molecule compounds or four-molecule compounds which are compounds of the two-molecule compounds. The density of impurities donated to the clad layers 11, 12 and 13 is preferred to be as high as possible without effecting degeneration phenomenon. According to the preferred embodiment of the present invention, the n-type impurity density is about $2 \times 10^{19}$ $cm^{-3}$ and p-type impurity density is about $5 \times 10^{18}$ $cm^{-3}$.

According to the present invention, since it is relatively difficult to form p-type clad layers in a semiconductor having wide band gap corresponding to green and blue color lights, the n-type clad layer is used as common electrode for green and blue color light emitting elements so that the self resistance and contact resistance are reduced. As shown in FIG. 1, the clad layer 12 is shared by blue and green light emitting elements.

The active layer 14 and 15 for blue and green light emitting elements are formed in a quantum well structure for emitting lights by electron-hole recombination processes. The active layer 14 and 15 are formed from compound semiconductor, such as $Ga_{1-x}In_xN$, $Ga_{1-x}Al_xN$ or $AlN_{1-x}(SiC)_x$, where the mole fraction x is adjusted to the wavelength of a specific color (for example, the wavelength of green color is from 500 nm to 540 nm and that of blue color is from 400 nm to 450 nm). Further, the mole fraction x is also adjusted so that the energy gap of the active layer 14 is different from those of the clad layers 11 and 12 by 0.4 eV and the energy gap of the active layer 15 is difference from those of the clad layers 12 and 13 by 1.0 eV.

The manufacturing processes for forming the above mentioned layers 11 to 15 are described in greater detail, hereinafter.

When forming clad layers of p-type and n-type nitride semiconductor epitaxial layers, impurities (Mg for p-type and Si for n-type) are injected into the mono-crystalline epitaxial layer by evaporating the impurities.

In case MBE is used to form the epitaxial layer, the nitrogen molecules in nitrogen gas are analyzed into nitrogen radicals by plasma. The flow rate of the nitrogen gas is about 1 sccm to about 10 sccm and the pressure of the chamber is about $10^{-4}$ to about $10^{-5}$ torr. The nitrogen gas plasma is formed from Pyrolitic Boron Nitride("PBN") and maintained away from the radio frequency("RF") induction coil in order to the impurity injection is maintained at minimum rate. The RF power supply uses conventional power of 300 W to 600 W having frequency of 13.56 MHz. Further, a thin film, which is highly conductive and stable in high temperature, is placed outside of the PBN in order to prevent the PBN from being damaged due to the high electric field concentrated on a specific part of the PBN by RF mismatching during plasma generating process. A PBN cap with a nozzle of 2 mm in diameter is placed on top of the plasma chamber and a deflection electrode is place on the PBN cap which is used to deflect or to accelerate nitrogen ions so that the controllability over the growth of the epitaxial layer is improved.

When a thin film of compound semiconductors of SiC or $AlN_{1-x}(SiC)$ is formed, the silicon(Si) atoms and carbon(C) atoms are provided from solid materials or gas sources, such as Si, $SiH_4$, pyrolitic graphite or $C_3H_8$.

Due to the discordance of crystalline structures between substrate and epitaxial layer, there may occur crystal defect and surface bending phenomena. In order to avoid these phenomena, when the clad layers 11, 12 and 13 are formed, the ions are accelerated by relatively high energy of about 20 eV to about 50 eV. In other words, since the ions having relatively high accelerating energy reach the surface of the substrate, the surface movement at low temperature is substantially compensated and high quality surface planarization can be achieved.

However, when the active layer 14 and 15 are formed, in order to avoid defects due to the ions from the plasma and form high quality epitaxial layers, the ion accelerating energy is reduced to under 15 eV and the substrate temperature is raised to over 750° C. In this case, the number of ions to the total number of ions and is neutral particles is made to be under $1/100$.

Figure 2:
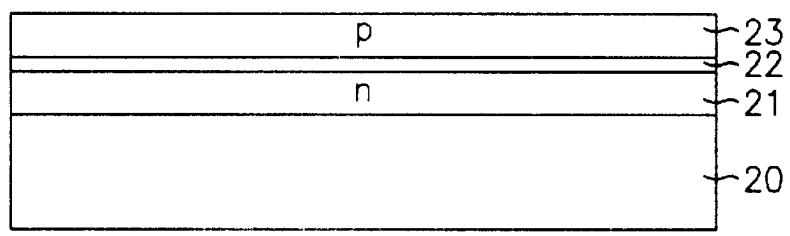
FIG. 2 is a cross sectional view showing a process step for forming a red color light emitting element a multicolor light emitting device according to the present invention.

Now, referring to FIG. 2, FIG. 2 is a cross sectional view showing a process step for forming a red color light emitting element. As shown in FIG. 2, an n-type clad layer 21, an active layer 2 and a p-type clad layer 23 for red color light emitting element are successively formed on a semiconductor substrate 20.

According to one embodiment of the present invention, the semiconductor substrate 20 is a GaAs substrate. The active layer 22 for red color light emitting element is formed from compound semiconductors, such as GaAsP, AlGaAs and InGaAlP, so that the wavelength of the radiated light is about 600 nm to 800 nm. The n-type and p-type clad layer 21 and 23 for red color light emitting element is formed of InGaAlP.

Figure 3A:
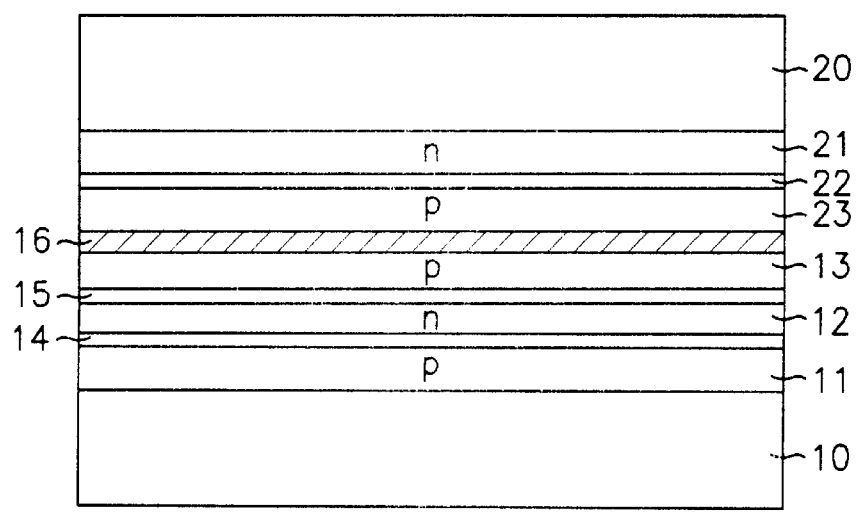
FIGS. 3a and 3b are cross sectional views showing process steps for forming a heterojunction structure of a multicolor light emitting device according to the present invention.
Figure 3B:
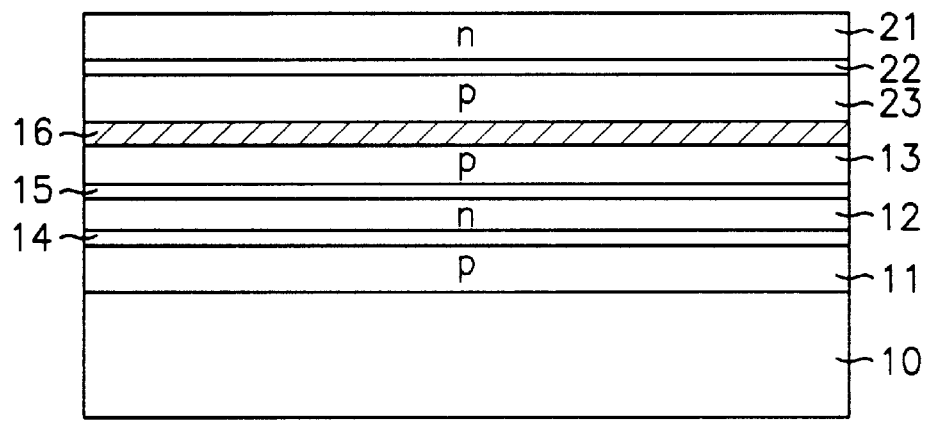

FIGS. 3a and 3b are cross sectional views showing process steps for forming a heterojunction structure of the multicolor light emitting device according to the present invention. As shown in FIG. 3a, the p-type clad layer 23 for red color light emitting element shown in FIG. 2 is bonded onto the transparent insulating layer 16 on the p-type clad layer 13 for blue color light emitting element shown in FIG. 1. Referring to FIG. 3b, the semiconductor substrate 20 is removed by etching process.

The wafer bonding technology for bonding layers formed on separate substrates is performed by heating the layers under appropriate pressure. And the wafer bonding is commonly used in the art of the present invention because the radiation efficiency is improved by light emitting elements of good crystalline structures which are formed by optimum process conditions for each element.

In order to simplify the manufacturing process, it is also possible to form the red color light emitting element on the transparent insulating layer 16 of FIG. 1.

Figure 4:
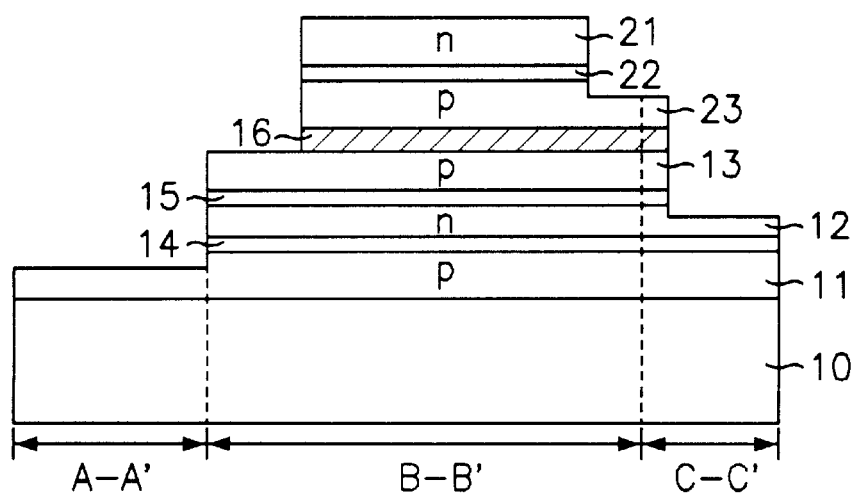
FIG. 4 is a cross sectional view showing a process step for forming an ohmic contact of a multicolor light emitting device according to the present invention.

FIG. 4 is a cross sectional view showing a process step for forming ohmic contacts of the multicolor light emitting device according to the present invention. The ohmic contact areas are defined by performing photolithography process on the clad layers 11, 12, 13, 23 and 21.

A reactive ion beam etching or a reactive ion etching is used to form the ohmic contacts. $CF_4$, $CCl_2F_2$ or $Cl_2$ is used as reactive mixture gas together with Ar. In order to improve etch rate, the acceleration potential of ion by plasma potential is controlled to be higher than about 200 volts. The etching temperature is maintained under 250° C. to avoid hardening and carbonization of the photo resist.

After the etching process, carbonic residues are removed by oxygen plasma. The oxygen plasma is generated by RF power of about 50 watts to about 100 watts under the pressure of about 100 mtorr to 1000 mtorr. After the carbonic residues are removed by the oxygen plasma, in order to reduce defects generated during the etching process, the transparent insulating layer 16, the p-type clad layer 11 for blue color light emitting element, the n-type clad layer 12 for blue and green color light emitting element, the p-type clad layer 13 for green color light emitting element are etched by wet etching with chemicals in which HF, $NH_3OH$, $HNO_3$ and $H_2O_2$ are mixed.

Figure 5A:
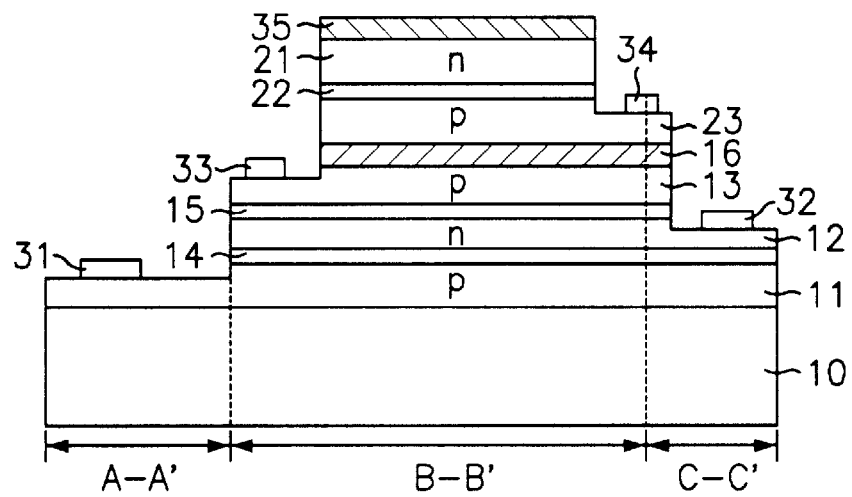
FIG. 5a is a cross sectional view showing metal contact layers for the ohmic contact formed on a multicolor light emitting device according to the present invention.
Figure 5B:
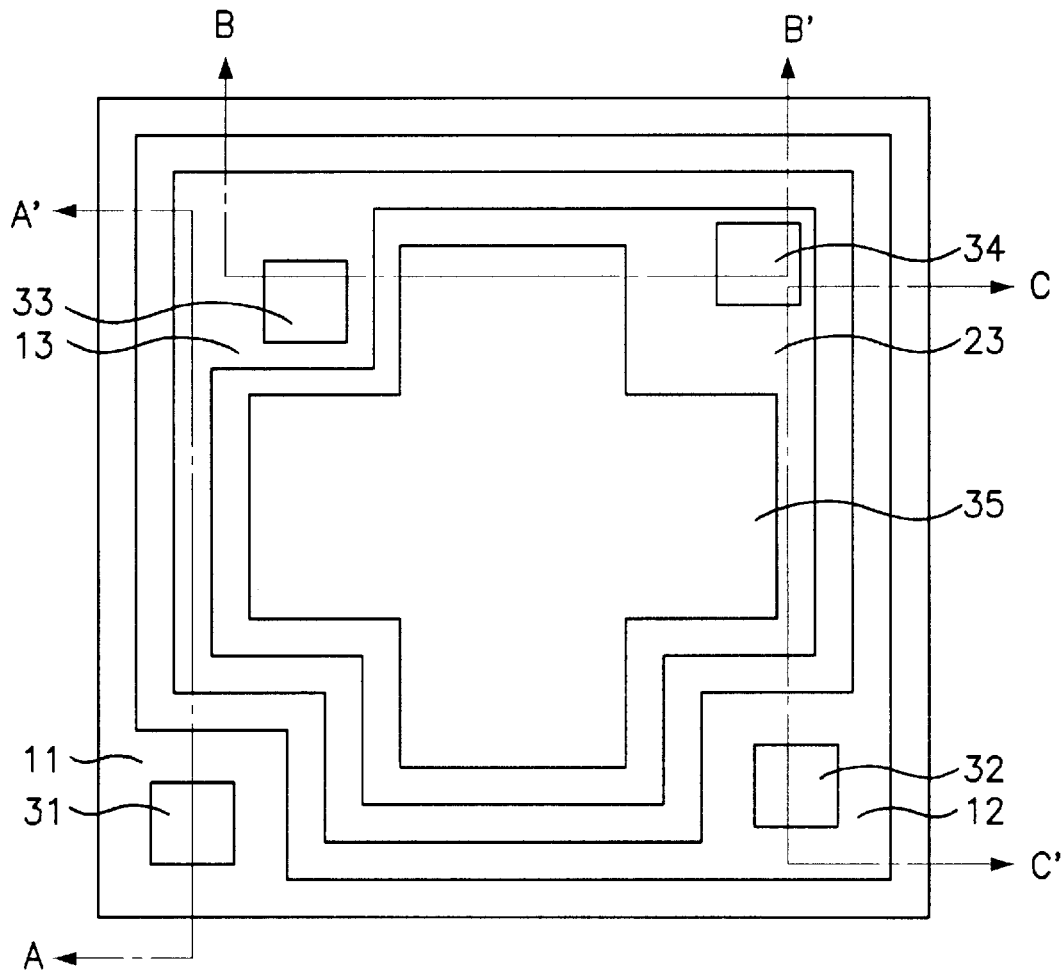

FIG. 5a is a cross sectional view showing metal contact layers for the ohmic contact formed on the multicolor light emitting device according to the present invention and FIG. 5b is a plan view of FIG. 5a. As shown in FIG. 5, metal contact layers 31, 32, 33, 34 and 35 for ohmic contacts are formed on the ohmic contact areas of the p-type clad layer 11 for blue color light emitting element, the n-type clad layer 12 for blue and green color light emitting element, the p-type clad layer 13 for green color light emitting element and the p-type and n-type clad layers 23 and 21 for red color light emitting element, respectively.

In order to form a metal contact layer 31, 32, 33, 34 or 35 for ohmic contact, a lift-off pattern is first formed on the ohmic contact area. Then, a metal layer is formed on the lift-off pattern by sputtering or electron beam deposition. Finally, the lift-off pattern is removed.

When different kind of metals are respectively used for the ohmic contact areas of the p-type clad layer 11 for blue color light emitting element, the n-type clad layer 12 for blue and green color light emitting element, the p-type clad layer 13 for green color light emitting element and the p-type and n-type clad layers 23 and 21 for red color light emitting element, the process for forming photoresist pattern, the process for forming metal layer and the process for removing the photoresist pattern are subsequently performed several times in consideration of the differences of heat treatment temperatures.

In detail, when GaN is used for forming the p-type clad layers 11 and 13, GaAs is used for forming the n-type clad layer 12 and InGaAlP is used for forming the p-type and n-type clad layers 23 and 21, the process for forming the metal contact layers 31, 32, 33, 34 and 35 for ohmic contacts is as follows: a photoresist pattern is formed to expose the ohmic contact area on the p-type clad layers 11 and 13 for blue and green color light emitting elements, a metal alloy layer of Cr and Au is formed to about 20 nm to about 200 nm and the photoresist pattern is removed to form the metal contact layers 31 and 33 on the clad layers 11 and 13. Then, a rapid thermal annealing is performed at about 900° C. for 1 minute. The contact resistances of the metal contact layers 31 and 33 are lower than $1 \times 10^{-3}$ ohms/cm$^2$. Then, a photoresist pattern is formed to expose the ohmic contact area on the n-type clad layer 12 for blue and green color light emitting element, a metal alloy layer of Ti and Al is formed to about 20 nm to about 200 nm and the photoresist pattern is removed to form the metal contact layers 31 and 33 on the clad layer 12. By performing the similar processes, the metal contact layer 34 is formed of the metal alloy of Zn and Au on the p-type clad layer 23 for red color light emitting element, and the metal contact layer 35 is formed of the metal alloy of Ni and AuGe on the n-type clad layer 21 for red color light emitting element. And a thermal annealing is performed on the metal contact layers 34 and 35.

Figure 6A:
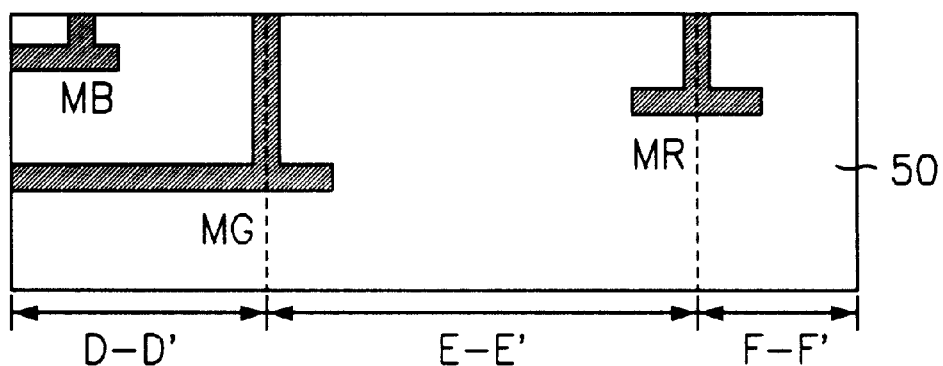
FIG. 6a is a cross sectional view showing conducting lines formed on a wiring substrate of a multicolor light emitting device according to the present invention.
Figure 6B:
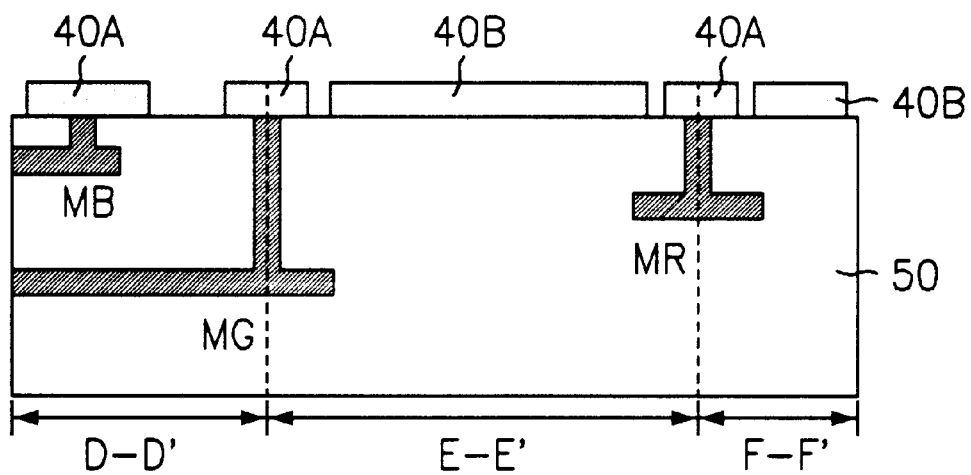
FIG. 6b is a cross sectional view showing metal pad layers formed on the wiring substrate of FIG. 6a according to the present invention.
Figure 6C:
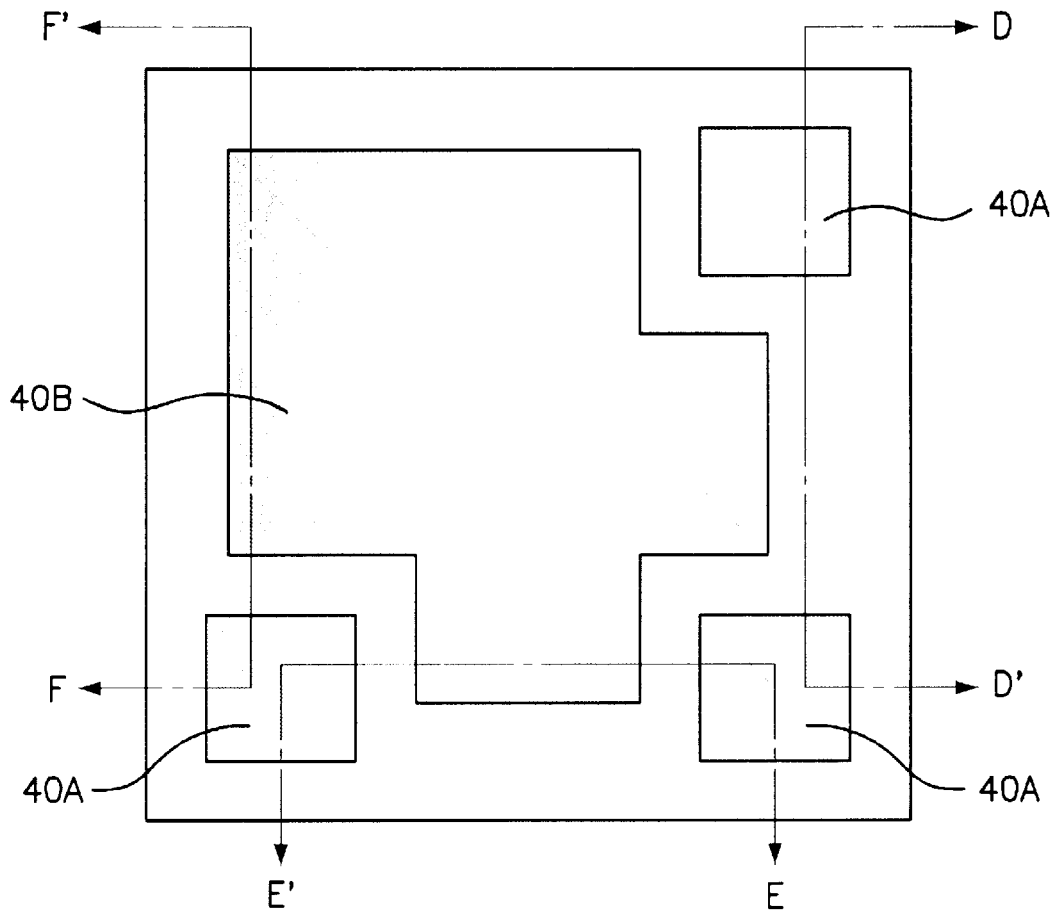
FIG. 6c is a plan view of FIG. 6b.

FIG. 6a is a cross sectional view showing conducting lines MB, MG and MR formed in a wiring substrate 50 of the multicolor light emitting device according to the present invention, FIG. 6b is a cross sectional view showing metal pad layers 40A's and 40B's formed on the wiring substrate 50 of FIG. 6a according to the present invention, and FIG. 6c is a plan view of FIG. 6b. As shown in FIGS. 6a, 6b and 6c, the metal pad layers 40A's are formed on the conducting lines MB, MG and MR and coupled to the p-type clad layers 23, 13 and 11, respectively. The metal pad layers 40B is formed on the wiring substrate 50 and coupled to the n-type clad layers 21 and 12 for the red, green and blue color light emitting elements.

The wiring board 50 is formed of glass epoxy, polymer board or dielectric board. The conducting lines MB, MG and MR are formed by patterning and annealing commercially available conductive epoxies or by selectively depositing and etching metal thin film patterns. The metal pad layers 40A's and 40B are formed of single layer, bi-layer or alloy thin films of Cu, Pt, Au, Pd, Al, Cr, Ni/Al, Ti/Au/Ti or TiW by sputtering, electron beam deposition or electroplating. The metal contact layers 31, 32, 33, 34 and 35 and the metal pad layers 40A's and 40B are formed of the materials having high reflectivity.

Figure 6D:
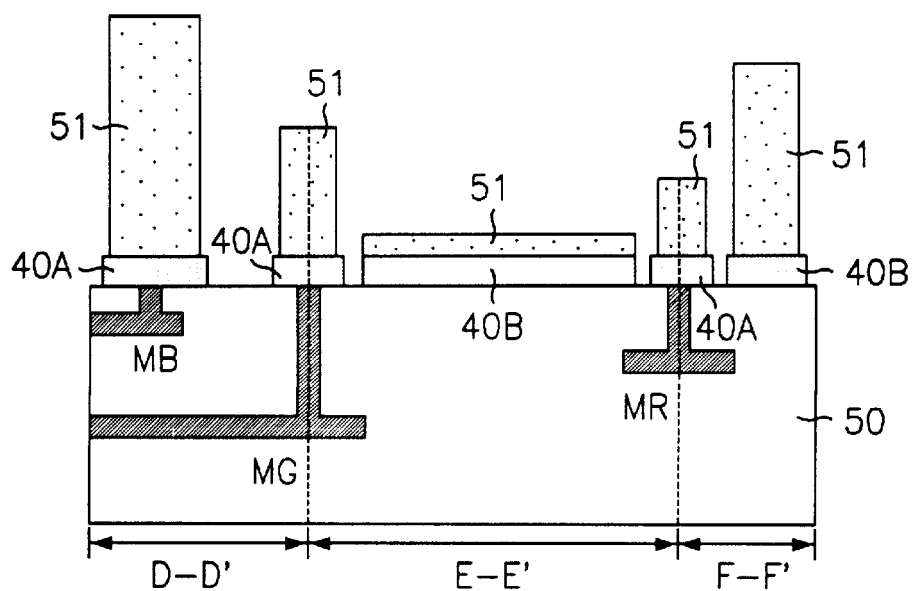
FIG. 6d is a cross sectional view showing metal bumps formed on the metal pad layers of FIG. 6b according to the present invention.

FIG. 6d is a cross sectional view showing metal bumps 51 formed on the metal pad layers 40A's and 40B of FIG. 6b according to the present invention. The height of each of the metal bumps 51 is determined by the cross sectional profile of the light emitting elements of FIG. 5a. The height of each of the metal bumps 51 are adjusted to make the transparent substrate 10 to be parallel to the wiring substrate 50. The metal bumps 51 are formed of metal alloy layers of InSnAu, PbAgCu or SnPb including Pb, Sn or In as major component by a conventional technology such as photolithography and deposition with polyimide and photoresist. The mixture ratio of the major component(Pb, Sn or In) is about 10% to 70%. The minimum width of the metal bumps is about 10 um to about 60 um.

Figure 7:
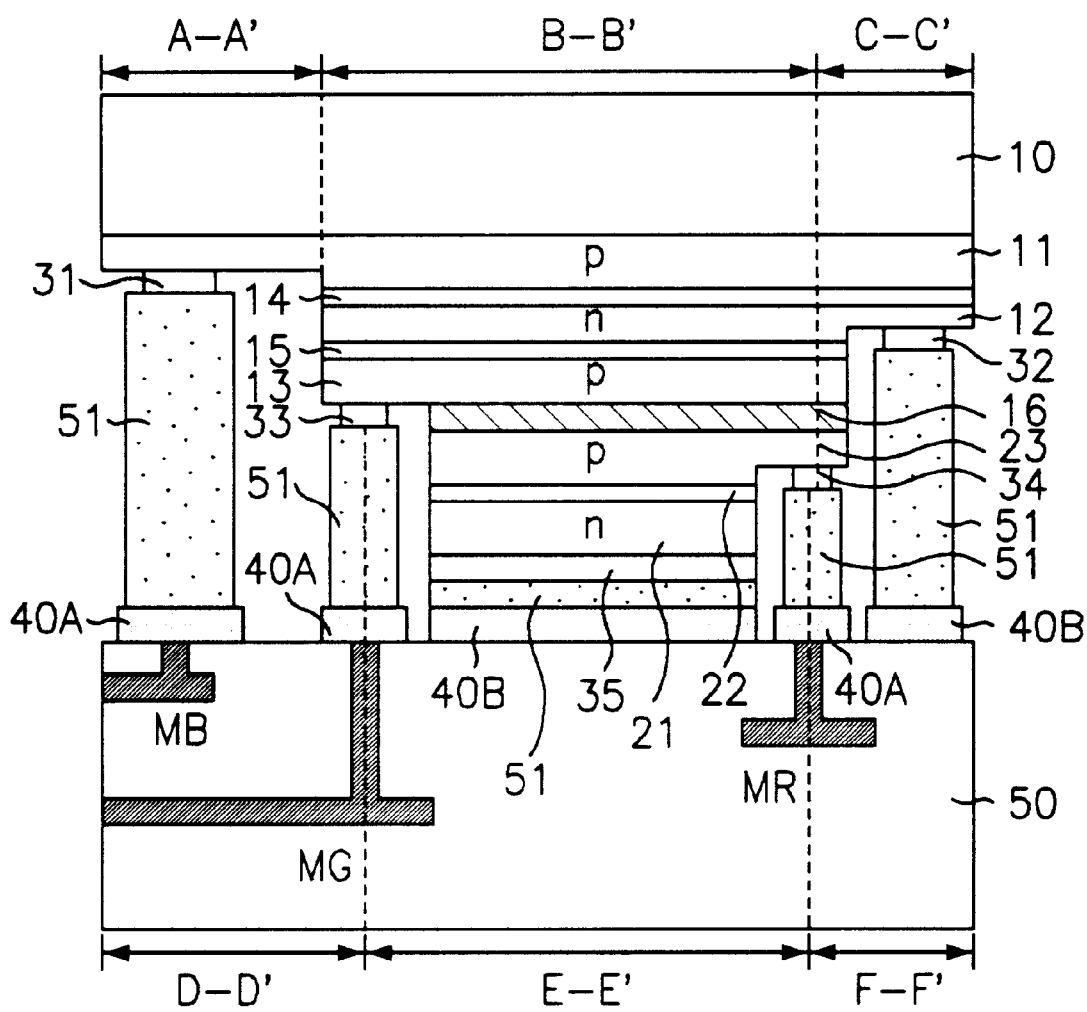
FIG. 7 is a cross sectional view showing a multicolor light emitting device according to the present invention.

FIG. 7 is a cross sectional view showing the multicolor light emitting device formed by bonding the metal bumps 51 of the wiring substrate of FIG. 6d onto the metal contact layers 31, 32, 33, 34 and 35 of the light emitting elements of FIG. 5a. The light emitting elements and the wiring substrate 50 are aligned by optical microscope and the alignment error is controlled to be less than 2 um. After the alignment is completed, the metal bumps 51 and the metal contact layers 31, 32, 33, 34 and 35 are bonded by supersonic bonder, thermocompressor or thermo-sonic bonder. When thermocompressor is used, the temperature is in the range of 100° C. to 400° C. and the pressure is in the range of about 5 Kgf to 15 Kgf per unit element. Under this condition, since the height of the metal bumps 51 is reduced by at least 30% of the original height, the possibility of contact defect due to the differences in height is very low.

As shown in FIG. 7, the light emitting device of the present invention includes the wiring substrate, the red color light emitting element, the green color light emitting element, blue color light emitting element and the transparent substrate in sequence. Therefore, the red color light radiated from the red color light emitting element is not absorbed by the green or blue color light emitting elements in the upper part. And the green color light radiated from the green color light emitting element is not absorbed by the blue color light emitting elements in the upper part. Further, the lights radiated from the lower part light emitting elements are spread out by the upper part element so that the effective the light source area becomes to be equal to the area of the p-type clad layer 11 of the blue color light emitting element.

By applying control signals to the conducting layers MB, MG or MR of the wiring substrate 50, lights of exact colors can be radiated from the light emitting device of the present invention. Further, The light emitting device of the present invention is integrated in matrix array of high density so that high resolution display panel can be achieved.

According to the present invention, the three light emitting devices for conventional electric display panel can be replaced by one light emitting device of the present invention. The resolution of the display panel using light emitting device of the present invention can be improved more than two times of that of the conventional CRT, PDP, LCD used in conventional TV's or monitors. Further, the thickness of the display panel using light emitting device of the present invention can be less than 1 cm.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A method for manufacturing a light emitting device comprising the steps of:

forming a p-type clad layer for blue color light emitting element, an active layer for blue color light emitting element, an n-type common clad layer, an active layer for green color light emitting element and a p-type clad layer for green color light emitting element on a transparent substrate, subsequently;

forming a transparent insulating layer on said p-type clad layer for green color light emitting element;

forming a p-type clad layer, an active layer and an n-type clad layer for red color light emitting element on said transparent insulating layer, subsequently;

forming ohmic contact areas on said p-type clad layer for blue color light emitting element, said n-type common clad layer, said p-type clad layer for green color light emitting element and said p-type clad layer for red color light emitting element, respectively;

forming metal contact layers on said ohmic contact areas of said p-type clad layer for blue color light emitting element, said n-type common clad layer, said p-type clad layer for green color light emitting element and said p-type clad layer for red color light emitting element, respectively;

forming a first, a second and a third electrode in a wiring substrate, wherein ends of said first, second and third electrode are destined to be coupled to said p-type clad layers of said blue, green and red light emitting elements, respectively;

forming a first and a second metal pad layers, wherein said first metal pad layer is destined to be coupled to said first, second and third electrodes and said second metal pad layer is destined to be coupled to said n-type clad layer for said red color light emitting element and said n-type common clad layer;

forming metal bumps of different height on said first and second metal pad layers, respectively;

bonding said metal contact layers onto said metal bumps, respectively, so that said red, green, blue color light emitting elements and said transparent substrate are formed in order.

2. The method as claimed in claim 1, wherein said p-type clad layer for blue color light emitting element, said active layer for blue color light emitting element, said n-type common clad layer, said active layer for green color light emitting element and said p-type clad layer for green color light emitting element are formed as epitaxial mono-crystalline layer.

3. The method as claimed in claim 2, wherein said p-type clad layer for blue color light emitting element, said active layer for blue color light emitting element, said n-type common clad layer, said active layer for green color light emitting element and said p-type clad layer for green color light emitting element are formed by molecular beam epitaxy including plasma generating means.

4. The method as claimed in claim 2, wherein said active layer for blue color light emitting element and said active layer for green color light emitting element are formed in quantum well structure, wherein the ion acceleration energy is lower than 15 eV, the substrate temperature is higher than 750° C. and the rate of the number of ions to the total number of ions and neutral particles is less than $1/100$.

5. The method as claimed in claim 2, wherein said step for forming said layers for red color light emitting element comprises:
    forming an n-type clad layer, an active layer and a p-type clad layer for red color light emitting element on a semiconductor substrate, subsequently;
    bonding said p-type clad layer for red color light emitting element onto said transparent insulating layer; and
    removing said semiconductor substrate.

6. The method as claimed in claim 3, wherein the height of each of said metal bumps is adjusted to make said transparent substrate 10 to be parallel to said wiring substrate.

7. The method as claimed in claim 3, wherein said step for forming ohmic contact area is performed by a reactive ion beam etching or a reactive ion etching, wherein reactive mixture gas selected from the group consisting of $CF_4$, $CCl_2F_2$ and $Cl_2$ is used in said etching process.

8. The method as claimed in claim 7, further comprising:
    after said step of forming ohmic contact area,
    removing residual carbonic components by oxygen plasma; and
    reducing the thickness of said transparent insulating layer, said p-type clad layer for blue color light emitting element, said n-type common clad layer and said p-type clad layer for green color light emitting element by etching with chemicals selected from the group consisting of HF, $NH_3OH$, $HNO_3$ and $H_2O_2$.

9. The method as claimed in claim 5, wherein said step for bonding said metal contact layers onto said metal bumps is performed by one of supersonic bonder, thermocompressor or thermosonic bonder after aligning and said wiring substrate to said blue, green and red color light emitting elements on said transparent substrate.

\* \* \* \* \*